United States Patent [19]

Ohtsuki

[11] Patent Number: 5,592,430
[45] Date of Patent: Jan. 7, 1997

[54] SEMICONDUCTOR DEVICE EQUIPPED WITH SIMPLE STABLE SWITCHING CIRCUIT FOR SELECTIVELY SUPPLYING DIFFERENT POWER VOLTAGES

[75] Inventor: Tetsuya Ohtsuki, Tokyo, Japan

[73] Assignee: NEC Corporation, Japan

[21] Appl. No.: 550,658

[22] Filed: Oct. 31, 1995

[30] Foreign Application Priority Data

Nov. 4, 1994 [JP] Japan ..................................... 6-271085

[51] Int. Cl.$^6$ ..................................................... G11C 7/00
[52] U.S. Cl. ..................... 365/226; 365/189.11; 327/530; 327/536; 327/548
[58] Field of Search .............................. 365/226, 189.11; 327/536, 548, 530

[56] References Cited

U.S. PATENT DOCUMENTS 5,258,950  11/1993  Murashima et al. ................ 365/189.05
5,461,591  10/1995  Kim et al. ............................... 365/226

OTHER PUBLICATIONS

Miyawaki et al, "A New Erasing And Row Decoding Scheme For Low Supply Voltage Operation 16-Mb/64-Mb Flash Memories", Apr. 1992, pp. 583-585, IEEE Journal of Solid-State Circuits, vol. 27, No. 4.

Ohtsuka et al, "A 62ns 16Mb CMOS EPROM With Adress Transition Detection Technique", Mar. 1991, pp. 262-263, International Solid-State Circuits Conference.

*Primary Examiner*—David C. Nelms
*Assistant Examiner*—Son T. Dinh
*Attorney, Agent, or Firm*—Hayes, Soloway, Hennessey, Grossman & Hage, P.C.

[57] ABSTRACT

An electrically erasable and programmable read only memory device is equipped with a supply voltage switching circuit responsive to a write enable signal for selectively supplying a write-in voltage and a read-out voltage through a power distribution line to a row address decoder unit, and the supply voltage switching circuit includes a series of first and second p-channel enhancement type field effect transistors having respective gate electrodes coupled to the write-in voltage line and the power distribution line, a third p-channel enhancement type field effect transistor having a gate electrode coupled to the power distribution line and a controlling sub-circuit responsive to the write enable signal so as to supply first and second control signals of the ground level and a third control signal of the potential level equal to the power distribution line to the first and second p-channel enhancement type field effect transistors and the third p-channel enhancement type field effect transistor when the write enable signal is in the active level.

11 Claims, 12 Drawing Sheets

PRIOR ART

| | CONTROL SIGNALS | | | | | | | | | SELECTED POWER SOURCE |
|---|---|---|---|---|---|---|---|---|---|---|
| IN1 | IN2 | IN3 | IN4 | ... | IN2i-1 | IN2i | ... | IN2n-3 | IN2n-2 | IN2n-1 | |
| 0 | 0 | V2 | V1 | ... | Vi | V1 | ... | Vn-1 | V1 | V1 | V1 |
| V1 | V2 | 0 | 0 | ... | Vi | V2 | ... | Vn-1 | V2 | V2 | V2 |
| .. | .. | .. | .. | ... | .. | .. | ... | .. | .. | .. | .. |
| V1 | Vi | V2 | Vi | ... | 0 | 0 | ... | Vn-1 | Vi | Vi | Vi |
| .. | .. | .. | .. | ... | .. | .. | ... | .. | .. | .. | .. |
| V1 | Vn-1 | V2 | Vi | ... | Vi | Vn-1 | ... | 0 | 0 | Vn-1 | Vn-1 |
| V1 | Vn | V2 | Vn | ... | Vi | Vn | ... | Vn-1 | Vn | 0 | Vn |

SEMICONDUCTOR DEVICE EQUIPPED WITH SIMPLE STABLE SWITCHING CIRCUIT FOR SELECTIVELY SUPPLYING DIFFERENT POWER VOLTAGES

FIELD OF THE INVENTION

This invention relates to a semiconductor device and, more particularly, to a semiconductor device equipped with a simple stable internal supply voltage switching circuit for selectively supplying different power voltages to a power distribution line.

DESCRIPTION OF THE RELATED ART

Figure 1:
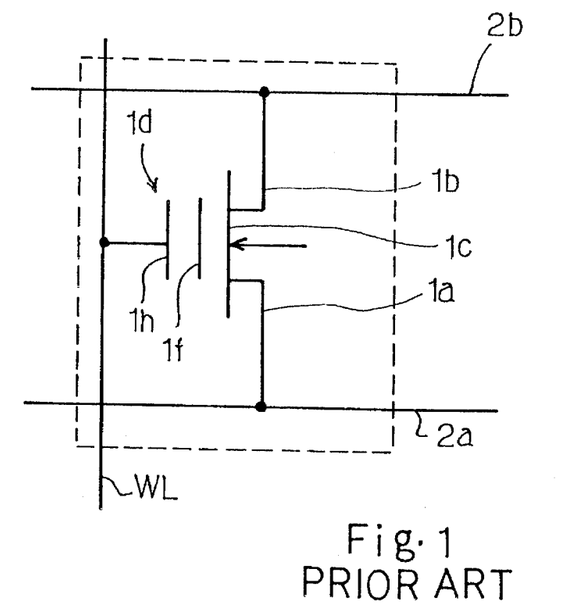
FIG. 1 is a view showing the symbol of the n-channel floating gate type field effect transistor.
Figure 2:
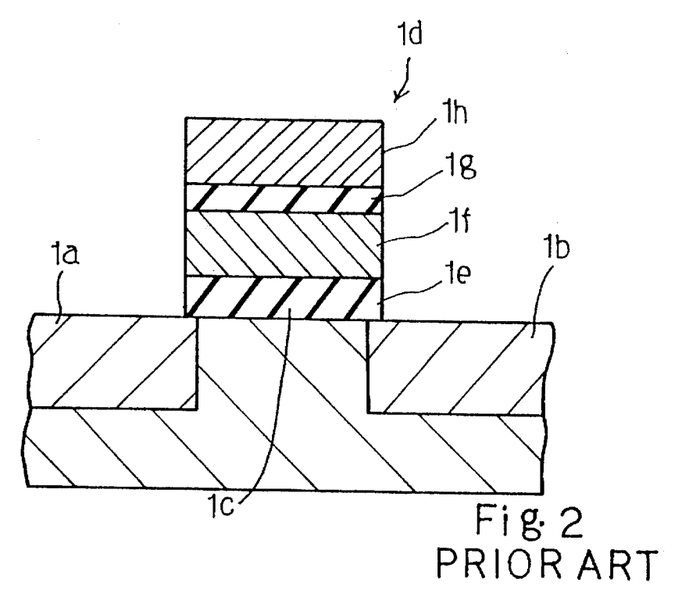
FIG. 2 is a cross sectional view showing the structure of the n-channel floating gate type field effect transistor.

In general, a-flash write electrically erasable and programmable read only memory device requires several power voltages for a write-in, an erase and a read-out. FIG. 1 illustrates a symbol of the n-channel floating gate type field effect transistor, and the structure of the n-channel floating gate type field effect transistor is shown in FIG. 2. The n-channel floating gate type field effect transistor has n-type source and drain regions 1a and 1b, a p-type channel region 1c between the n-type source and drain regions 1a and 1b and a stacked gate structure 1d provided over the p-type channel region 1c, and a tunnel insulating layer 1e, a floating gate electrode 1f, an inter-gate insulating layer 1g and a control gate electrode 1h as a whole constitute the stacked gate structure 1d.

A source line 2a is connected to the n-type source region 1a, and a digit line 2b is connected to the n-type drain region 1b. The tunnel insulating layer 1e and the inter-gate insulating layer 1g electrically isolate the floating gate electrode 1f from the n-type source and drain regions 1a and 1b and the control gate electrode 1h, and the control gate electrode 1h form a part of a word line WL.

Figure 3:
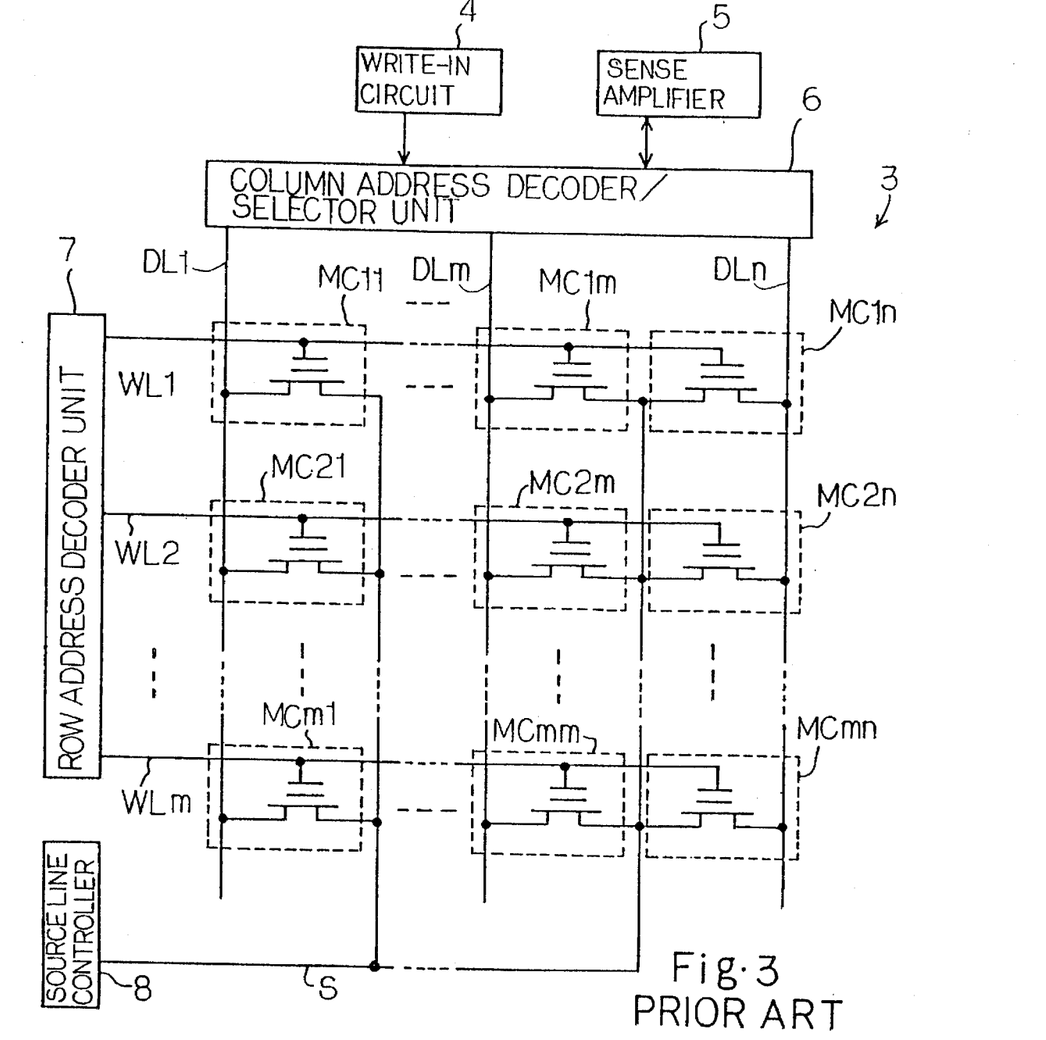
FIG. 3 is a circuit diagram showing the arrangement of the prior art flash-write electrically erasable and programmable read only memory device.

The n-channel floating gate type field effect transistor is available for a NOR type memory cell array 3a of the flash-write electrically erasable and programmable read only memory device as shown in FIG. 3. A plurality of digit lines DL1, DLm, ... and DLn are respectively associated with the columns of memory cells MC11–MCm1, MC1m–MCmm and MC1n–MCmn, and word lines WL1, WL2, ... and WLm form the control gate electrodes of the associated rows of memory cells MC11–MC1n, MC21–MC2n, ... and MCm1–MCmn. A source line S is shared between the memory cells MC11 to MCmn.

A write-in circuit 4 and a sense amplifier 5 are provided for the digit lines DL1 to DLn, and are coupled in parallel to a column address decoder/selector unit 6. On the other hand, the word lines WL1 to WLm are coupled to a row address decoder unit 7, and a source line controller 8 is coupled to the source line S. The row address decoder unit 7 is responsive to row address bits so as to select one of the word lines WL1 to WLm, and the column address bits cause the column address decoder/selector unit 6 to connect one of the digit lines DL1 to DLn to the write-in circuit 4 or the sense amplifier 5.

The flash-write electrically erasable and programmable read only memory device thus arranged behaves as follows. If the row address bits and the column address bits select the memory cell MC11 from the memory cell array 3. The column address decoder/selector unit 6 electrically connects the write-in circuit 4 to the digit line DL1, and the write-in circuit 4 applies 7 volts through the column address decoder/selector unit 6 to the digit line DL1. The row address decoder unit 7 boosts the word line WL1 to 12 volts, and the other word lines WL2 to WLm are maintained at zero. The source line S and the p-type semiconductor substrate are grounded.

The drain voltage reversely biases the p-n junction between the n-type drain region 1b of the memory cell MC11 and the p-type semiconductor substrate, and hot electrons are generated due to the strong electric field between the n-type source region 1a and the n-type drain region 1b. The hot electrons are injected into the floating gate electrode 1f through acceleration in the electric field between the control gate electrode 1h and the n-type drain region 1b, and are accumulated therein. The accumulated electrons increase the threshold of the n-channel floating gate type field effect transistor over 5 volts, and the memory cell MC11 enters into the write-in state.

The memory cells MC11 to MCmn are concurrently erased. The word lines WL1 to WLm are grounded, and the source line controller 8 applies 12 volts to the source line S. The p-type semiconductor substrate is grounded, and the digit lines DL1 to DLn is changed to floating state. The accumulated electrons are evacuated through the tunnel insulating layers 1e into the source line S. The thresholds of the n-channel floating gate type field effect transistors MC11 to MCmn are decreased below 5 volts, and concurrently enter into erased state.

The write-in state and the erased state are corresponding to two logic levels of a data bit stored in the memory cell, and the data bit is read out through the read-out. The memory cell MC11 is assumed to be accessed. The column address decoder/selector unit 6 electrically connects the digit line DL1 to the sense amplifier 5, and the sense amplifier 5 applies 1 volt through the column address decoder/selector unit 6 to the digit line DL1. The source line S is grounded. The row address decoder unit 7 applies 5 volts to the word line WL1, and the other word lines WL2 to WLm remain zero. The sense amplifier 5 checks the potential level on the selected digit line DL1 to see whether the n-channel floating gate type field effect transistor turns on or off.

If the n-channel floating gate type field effect transistor MC11 turns on, current flows from the selected digit line DL1 into the source line S, and the potential level on the digit line DL1 is decayed. Then, the sense amplifier 5 determines the n-channel floating gate type field effect transistor to be in the erased state.

On the other hand, if the n-channel floating gate type field effect transistor turns off, the n-channel floating gate type field effect transistor maintains the potential level on the digit line DL1, and the sense amplifier 5 decides the n-channel floating gate type field effect transistor MC11 to be in the write-in state.

Thus, the row address decoder unit 7 applies different potential levels to the selected word line between the write-in and the read-out. The write-in voltage is usually supplied from the outside of the flash-write electrically erasable and programmable read only memory device, and a supply power switching circuit is usually incorporated in the flash-write electrically erasable and programmable read only memory device so as to change the power supply to the row address decoder unit 7 between 12 volts and 5 volts.

Figure 4:
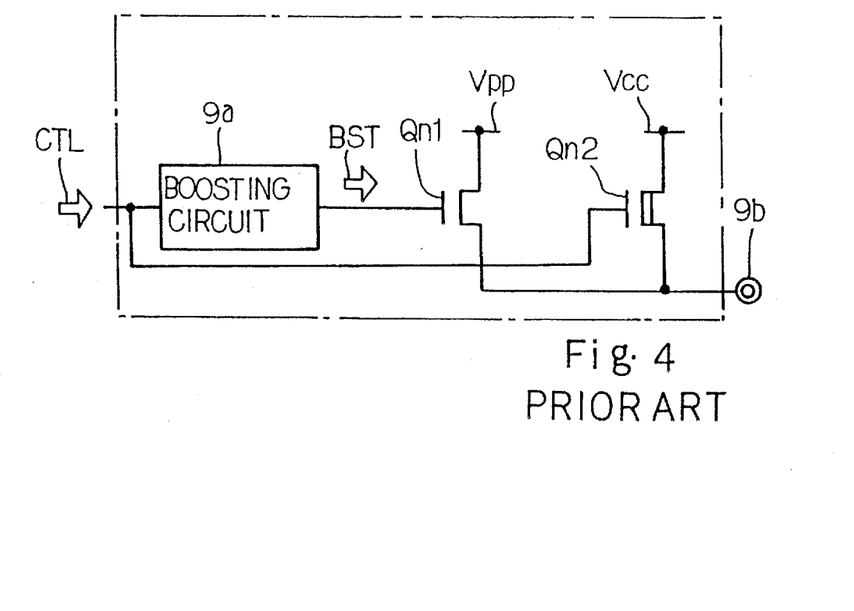
FIG. 4 is a circuit diagram showing the arrangement of the supply power switching circuit incorporated in the prior art flash-write electrically erasable and programmable read only memory device.

FIG. 4 illustrates the supply power switching circuit incorporated in the prior art flash-write electrically erasable and programmable read only memory device. The supply power switching circuit includes a boosting circuit 9a, an n-channel enhancement type switching transistor Qn1 coupled between a write-in voltage line Vpp and an output node 9B and an n-channel depletion type switching transistor Qn2 coupled between a power supply line Vcc and the output node 9B. An control signal CTL of 5 volts is supplied to the boosting circuit 9a and the gate electrode of the n-channel depletion type switching transistor Qn2 and the boosting circuit 9a changes the output signal BST between zero volt and 17 volts. The power supply line Vcc supplies positive power voltage Vcc of 5 volts, and the threshold of the n-channel depletion type switching transistor Qn2 is zero volt.

Figures 5A, 5B:
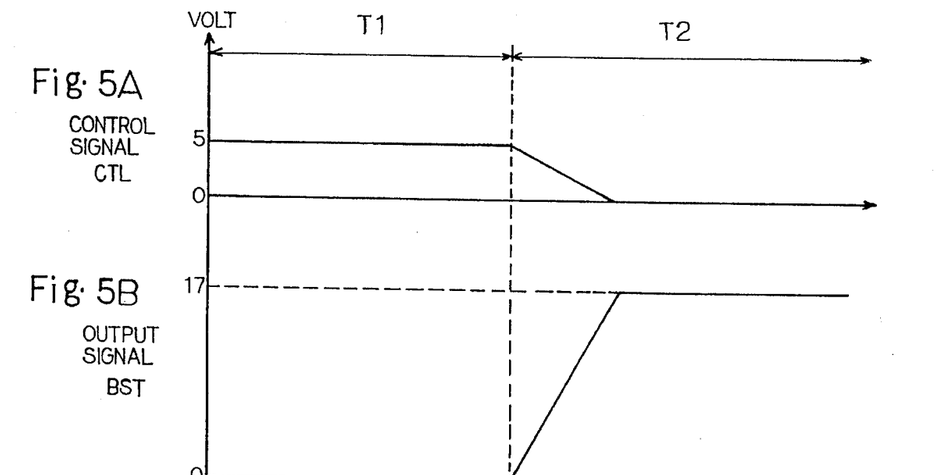
Figure 5C:
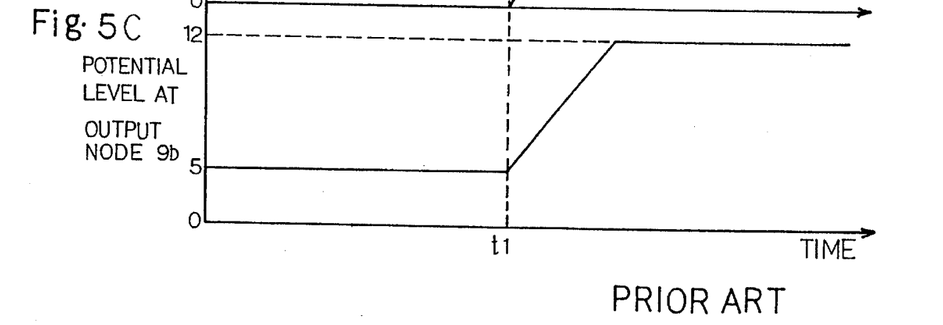

The supply power switching circuit behaves as shown in FIGS. 5A–5C While the control signal CTL is staying at 5 volts as in time period T1, the boosting circuit 9a maintains the output signal BST at zero, and the output signal BST is lower than the write-in voltage Vpp. For this reason, the n-channel enhancement type switching transistor Qn1 is turned off. On the other hand, the control signal CTL of 5 volts allows the n-channel depletion type switching transistor Qn2 to turn on, and the positive power voltage Vcc is supplied to the output node 9b.

If the control signal CTL is changed to the ground level at time t1, the boosting circuit 9a changes the output signal BST to 17 volts, and the n-channel enhancement type switching transistor Qn1 turns on. The n-channel enhancement type switching transistor Qn1 transfers the write-in voltage of 12 volts to the output node 9b.

Although the gate electrode of the n-channel depletion type switching transistor Qn2 is ground level, the write-in voltage of 12 volts at the source/drain node thereof makes the gate voltage thereof lower than the threshold, and the n-channel depletion type switching transistor Qn2 turns off. Thus, the supply power switching circuit supplies the write-in voltage in the time period T2.

Figure 6:
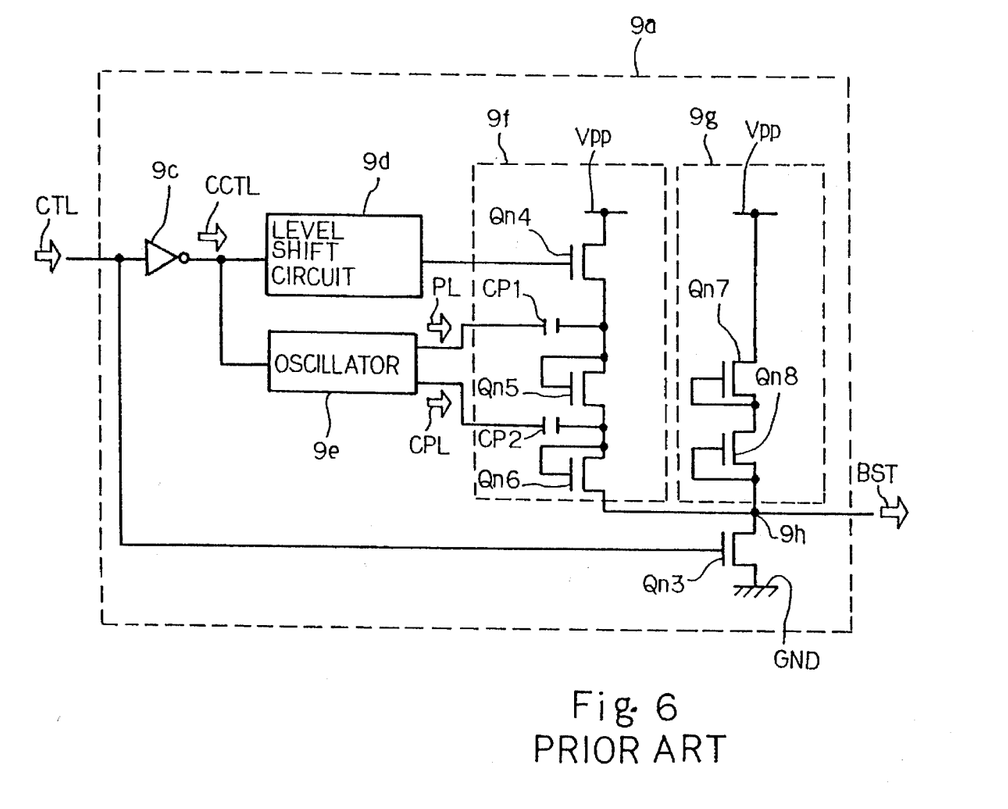
FIG. 6 is a circuit diagram showing the arrangement of the boosting circuit incorporated in the supply power switching circuit.

FIG. 6 illustrates the circuit arrangement of the boosting circuit 9a. The boosting circuit 9a includes an inverter 9c, a level shift circuit 9d, an oscillator 9e, a charge-pump circuit 9f, a voltage limiter 9g and an n-channel enhancement type discharge transistor Qn3 connected to an output node 9h, and the output signal 9h is supplied from the output node 9h to the gate electrode of the n-channel enhancement type switching transistor Qn1.

The inverter 9c produces a complementary control signal CCTL or the inverted signal of the control signal CTL, and supplies the complementary control signal CCTL to the level shift circuit 9d and the oscillator 9e. While the complementary control signal CCTL is staying in the ground level, the level-shift circuit 9d and the oscillator 9e stand idle, and, accordingly, the charge pump circuit 9f does not increase the potential level at the output node 9h.

The level shift circuit 9d is responsive to the complementary control signal CCTL of 5 volts so as to supply 12 volts to the charge pump circuit 9f. The oscillator 9e is also responsive to the complementary control signal CCTL of 5 volts for generating a boosting pulse signal PL and the complementary pulse signal CPL.

The charge pump circuit 9f includes a series of n-channel enhancement type filed effect transistors Qn4, Qn5 and Qn6 coupled between the write-in voltage line Vpp and the output node 9h and boosting capacitors CP1 and CP2 coupled between the n-channel enhancement type field effect transistors Qn4 and Qn5 and between the n-channel enhancement type field effect transistors Qn5 and Qn6. The output signal of the level shift circuit 9d is supplied to the gate electrode of the n-channel enhancement type field effect transistor Qn4, and activates the charge pump circuit 9f. The boosting pulse signal PL1 and the complementary pulse signal CPL are respectively supplied to the boosting capacitors CP1 and CP2, and the potential range of the boosting and complementary boosting pulse signals PL and CPL is 12 volts.

The voltage limiter 9g is implemented by a series of n-channel enhancement type switching transistors Qn7 and Qn8, and the series of n-channel enhancement type switching transistors Qn7 and Qn8 is coupled between the write-in voltage line Vpp and the output node 9h. The gate electrodes of these transistors Qn7 and Qn8 are coupled to the source nodes thereof, and the potential level at the output node 9h does not exceed 17 volts, i.e., Vpp+ the threshold of the transistor Qn8 (Vth8)+ the threshold of the transistor Qn7(Vth7).

The boosting circuit 9a thus arranged behaves as follows. While the control signal CTL is staying at 5 volts, the inverter 9c keeps the complementary control signal CCTL at the ground level, and the level shift circuit 9d and the oscillator 9e are disabled. The control signal CTL of 5 volts causes the n-channel enhancement type switching transistor Qn3 to turn on, and the n-channel enhancement type switching transistor Qn3 electrically connects the output node 9h to the ground voltage line GND. For this reason, the output signal BST is in the ground level.

On the other hand, when the control signal CTL is changed to the ground level, the inverter 9c supplies the complementary control signal CCTL of 5 volts to the level shift circuit 9d and the oscillator 9e. The level shift circuit 9d supplies 12 volts to the gate electrode of the n-channel enhancement type field effect transistor Qn4, and the n-channel enhancement type field effect transistor Qn4 turns on. As a result, the charge pump circuit 9f is enabled for boosting the potential level at the output node 9h.

The oscillator 9e starts the oscillation, and the boosting pulse signal PL and the complementary boosting pulse signal CPL cause the boosting capacitors CP1 and CP2 to supply the electric charge, and the n-channel enhancement type field effect transistors Qn5 and Qn6 transfer the electric charge to the output node 9h. As a result, the potential level at the output node 9h is increased. However, the voltage limiter 9g does not allow the potential level at the output node 9h to exceed over 17 volts.

Figure 7:
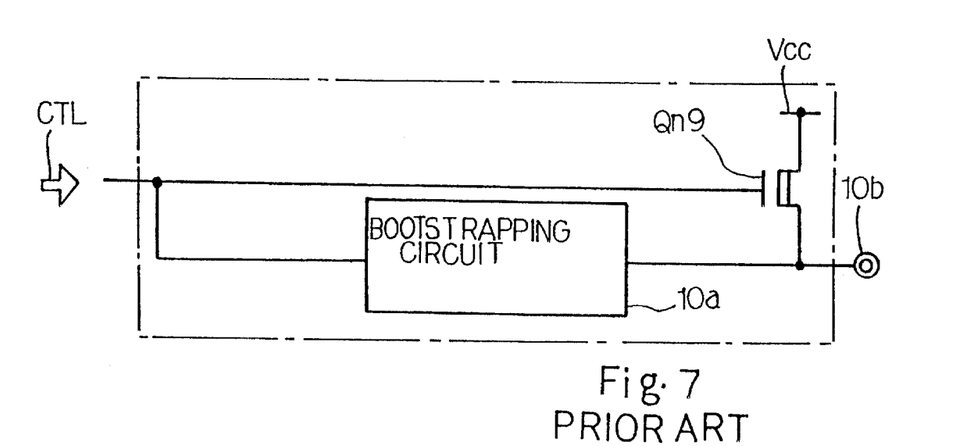
FIG. 7 is a circuit diagram showing the arrangement of the supply power switching circuit using the bootstrap circuit.

FIG. 7 illustrates another supply power switching circuit, and the supply power switching circuit includes a bootstrapping circuit 10a and an n-channel depletion type switching transistor Qn9. The bootstrapping circuit 10a is responsive to the control signal CTL so as to increase the potential level at the output node 10b through the bootstrapping phenomenon. The n-channel depletion type switching transistor Qn9 is coupled between the power voltage line Vcc and the output node 10b, and the control signal CTL is further supplied to the gate electrode of the n-channel depletion type switching transistor Qn9.

While the control signal CTL is staying at 5 volts, the n-channel enhancement type switching transistor is turned on, and supplies the positive power voltage Vcc to the output node 10b.

On the other hand, when the control signal CTL is changed to the ground level, the bootstrapping circuit 10a starts the bootstrapping function, and increases the potential level at the output node 10b to 12 volts. The boosted potential level at the output node 10b causes the n-channel depletion type switching transistor Qn9 to turn off.

Figure 8:
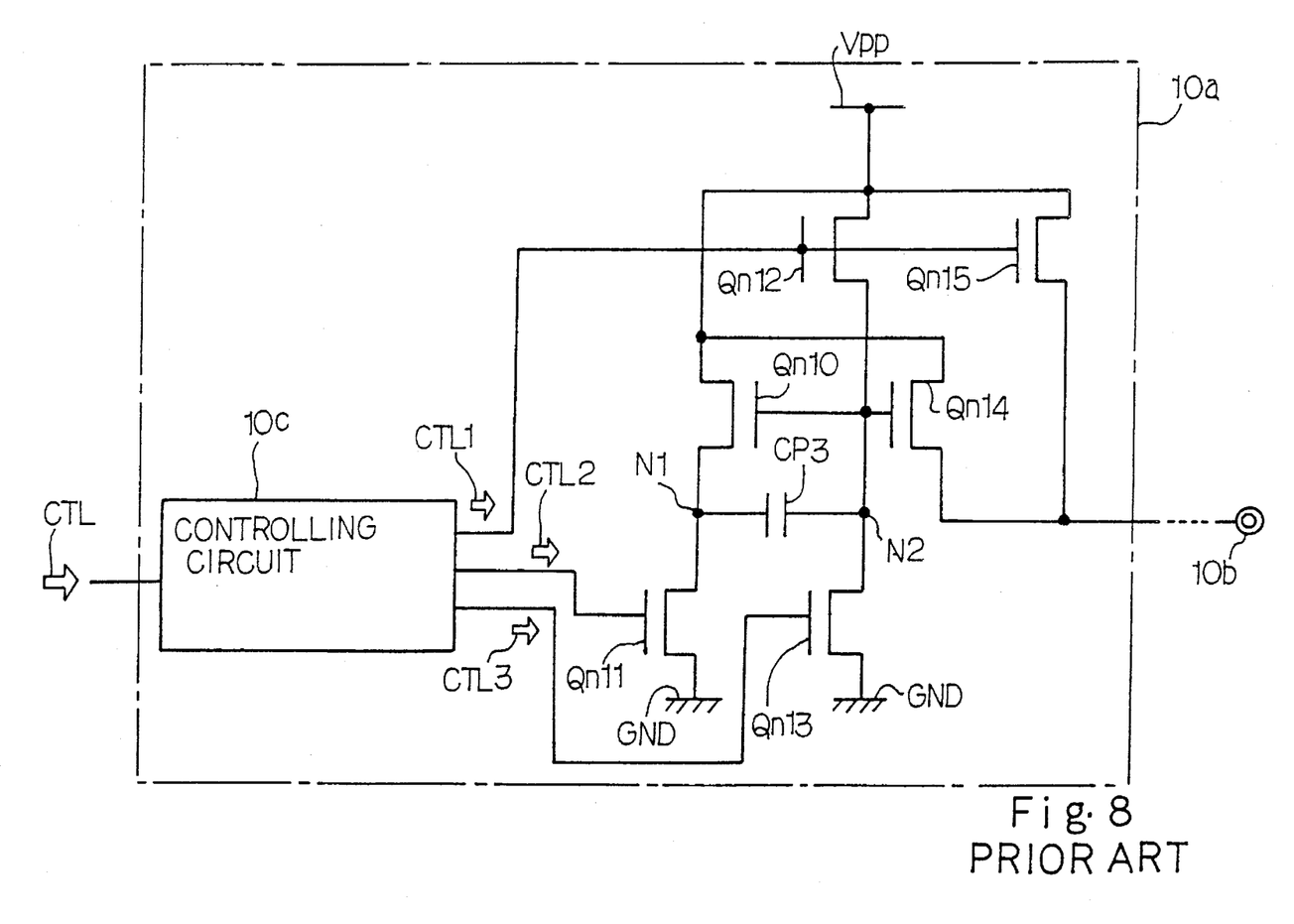
FIG. 8 is a circuit diagram showing the circuit arrangement of the bootstrapping circuit incorporated in the supply power switching circuit.
Figure 9A:
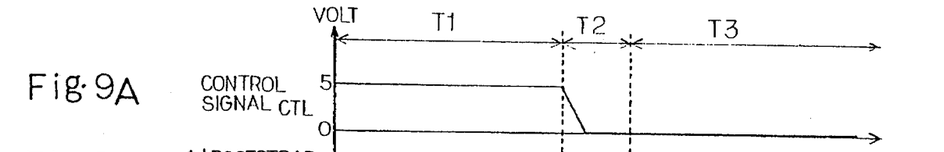
Figure 9B:
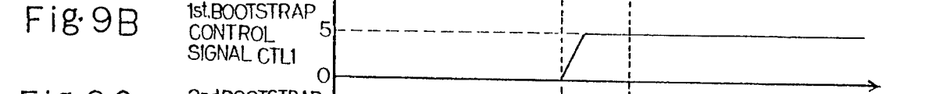
Figure 9C:
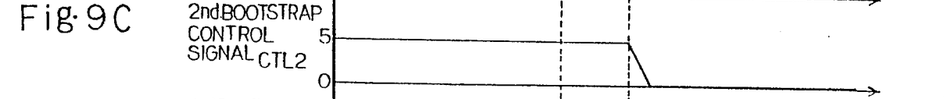
Figures 9D, 9E, 9F:
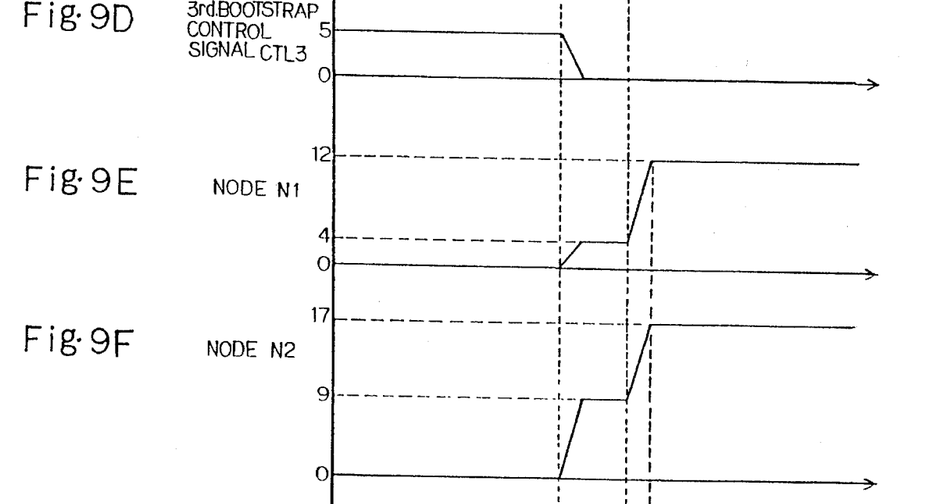
Figure 9G:
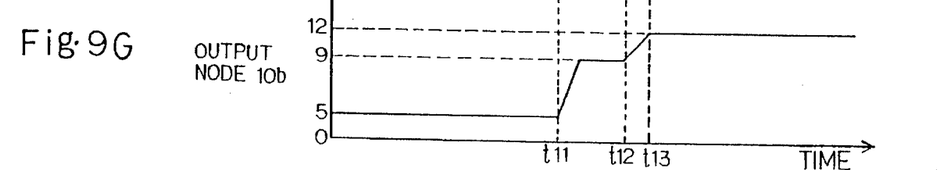

The circuit arrangement of the bootstrapping circuit 10a is illustrated in FIG. 8, and FIG. 9A–9B illustrates the bootstrapping function. The circuit arrangement and the bootstrapping function are similar to those of the boost circuit disclosed in "A New Erasing and Row Decoding Scheme for Low Supply Voltage Operation 16Mb-64-Mb Flash Memories" IEEE Journal of Solid-State Circuits, vol. 27, No. 4, April 1992, pages 583 to 585.

The bootstrapping circuit 10a includes a controlling circuit 10c, and the controlling circuit 10c is responsive to the control signal CTL for producing first to third bootstrap control signals CTL1, CTL2 and CTL3.

The bootstrapping circuit 10a further includes a first series circuit of n-channel enhancement type switching transistors Qn10 and Qn11 coupled between the write-in voltage line Vpp and the ground voltage line GND, a second series combination of n-channel enhancement type switching transistors Qn12 and Qn13 also coupled between the write-in voltage line Vpp and the ground voltage line GND and two n-channel enhancement type switching transistors Qn14 and Qn15 coupled in parallel between the write-in voltage line Vpp and the output node 10b. The first bootstrap control signal CTL1 is supplied to the gate electrodes of the n-channel enhancement type switching transistors Qn12 and Qn15, and the second bootstrap control signal CTL2 is supplied to the gate electrode of the n-channel enhancement type switching transistor Qn11. The n-channel enhancement type switching transistor Qn13 is gated by the third bootstrap control signal CTL3, and the write-in voltage line Vpp is connected through the n-channel enhancement type switching transistor Qn12 to the gate electrodes of the n-channel enhancement type switching transistors Qn10 and Qn14.

The bootstrapping circuit 10a further includes a bootstrap capacitor CP3 coupled between nodes N1 and N2, and the bootstrap capacitor CP3 and the n-channel enhancement type switching transistor Qn10 form in combination a self-boosting loop.

While the control signal CLT is staying at 5 volts, the first bootstrap control signal CTL1 is in the ground level, and the second and third bootstrap control signals CTL2 and CTL3 are at 5 volts. The n-channel enhancement type switching transistors Qn12 and Qn15 and, accordingly, the n-channel enhancement type switching transistors Qn10 and Qn14 are turned off, and isolate the output node 10b from the write-in voltage line Vpp. The second and third bootstrap control signals CTL2 and CTL3 cause the n-channel enhancement type switching transistors Qn11 and Qn13 to turn on. As a result, the nodes N1 and N2 are grounded through the n-channel enhancement type switching transistors Qn11 and Qn13. Thus, the bootstrapping circuit 10a stands idle, and the output node 10b is in the floating state in time period T1.

If the control signal CTL starts to decay at time t10, the first bootstrap control signal CTL1 starts to rise toward 5 volts, and the third bootstrap control signal CTL3 starts to decay. However, the controlling circuit 10c maintains the second bootstrap control signal CTL2 at 5 volts. The n-channel enhancement type switching transistors Qn12 and Qn15 turn on, and the n-channel enhancement type switching transistor Qn13 turns off. The write-in voltage line Vpp is coupled through the n-channel enhancement type switching transistor Qn12 to the node N2, and the potential level at the node N2 rises to a certain voltage lower than the write-in voltage Vpp by the threshold Vth12 of the n-channel enhancement type switching transistor Qn12, i.e., Vpp–Vth12=9 volts. The write-in voltage line Vpp is further connected through the n-channel enhancement type switching transistor Qn15 to the output node 10b, and the output node 10b rises to the certain level of 9 volts.

The potential level at the node N2 causes the n-channel enhancement type switching transistors Qn10 and Qn14 to turn on, and the potential level at the node N1 is given by using the proportional distribution between the channel resistances of the n-channel enhancement type switching transistors Qn10 and Qn11. In this instance, the node N1 is regulated to 4 volts.

Thus, the nodes N1 and N2 are charged at different levels in time period T2.

If the controlling circuit 10c decays the second bootstrap control signal CTL2 at time t12, the n-channel enhancement type switching transistor Qn11 turns off, and the node N1 is isolated from the ground voltage line GND. The node N1 rises toward a certain level lower than the write-in voltage Vpp by the threshold of the n-channel enhancement type switching transistor Qn10. The elevation of the potential level at the node N1 pushes up the potential level at the node N2 through the bootstrap capacitor CP3, and the increased potential level at the node N2 is propagated to the drain node of the n-channel enhancement type witching transistor Qn12 and the gate electrodes of the n-channel enhancement type switching transistors Qn10 and Qn14. Then, the drain node of the n-channel enhancement type switching transistor Qn12 becomes higher than the gate voltage thereof, and the n-channel enhancement type switching transistor Qn12 turns off. The n-channel enhancement type switching transistors Qn10 and Qn14 decrease the channel resistances, and the potential level at the node N2 is further increased through the self-boosting loop.

Thus, the node N2 is boosted to 17 volts at time t13, and the n-channel enhancement type switching transistor Qn14 transfers the write-in voltage of 12 volts to the output node 10b.

A problem inherent in the prior art supply power switching circuits is the complexity of the circuit arrangements. As described with reference to FIGS. 6 and 8, the boosting circuit 9a and the bootstrapping circuit 10a require a large number of component transistors, and the control sequence is complex. If the prior art supply power switching circuits handle more than two potential levels, the problem becomes more serious.

Another problem is reliability of the supply power switching circuits upon unexpected potential drop on the write-in voltage line Vpp. As shown in FIGS. 4 and 7, the control signal CTL is directly supplied to the gate electrodes of the n-channel depletion type switching transistors Qn2 and Qn9. As described hereinbefore, the write-in voltage Vpp keeps the n-channel depletion type switching transistors Qn2 and Qn9 off.

If the potential level at the output node 9b is, by way of example, decayed to about 3 volts due to the potential drop on the write-in voltage line Vpp, the n-channel depletion type switching transistors Qn2 and Qn9 turn on, and provide current path to the power voltage line Vcc. Moreover, the charge pump circuit 9f can not boost the output signal BST to 17 volts, and the n-channel enhancement type switching transistor Qn1 hardly transfers the potential level on the write-in voltage line Vpp. As a result, the row address decoder unit 7 insufficiently energizes the selected word line, and the selected n-channel floating gate type field effect transistor hardly increases the threshold.

As to the bootstrapping circuit 10a, the node N2 is boosted to 17 volts through the bootstrapping phenomenon, and the n-channel enhancement type switching transistors Qn12 and Qn13 confine the boosted level at the node N12. However, the electric charge at the node N2 flows out as leakage current, and the potential level at the node N2 is decayed. As a result, the n-channel enhancement type switching transistor Qn14 can not transfer the write-in voltage Vpp without potential drop, and the row address decoder unit 7 merely insufficiently energizes the selected word line. The write-in operation consumes time longer than the read-out operation, and the leakage current slightly more than a standard level deteriorates the reliability of the write-in operation.

SUMMARY OF THE INVENTION

It is therefore an important object of the present invention to provide a semiconductor device a supply power switching circuit of which is reliable and simple without a high-withstand transistor.

In accordance with the present invention, there is provided a supply voltage switching circuit incorporated in a semiconductor integrated circuit device, comprising: a plurality of first series sub-circuits coupled a power distribution line and a plurality of power supply lines different in power voltage thereon, each of the plurality of first series sub-circuits including a first p-channel enhancement type transistor having a first source node coupled to associated one of the plurality of power supply lines, a first gate electrode and a first drain node and a second p-channel enhancement type transistor having a second source node coupled to the first drain node, a second gate electrode and a second drain node coupled to the power distribution line; and a controlling sub-circuit coupled to the plurality of first series sub-circuits, and responsive to a selecting signal indicative of one of the plurality of power supply lines so as to producing a first control signal of a first certain potential level lower than the power voltage on associated one of the plurality of power supply lines by a first threshold level of the first p-channel enhancement type transistor coupled to the one of the plurality of power supply lines, a second control signal of a second certain potential level lower than a potential level on the power distribution line by a second threshold of the second p-channel enhancement type transistor associated with the one of the plurality of power supply lines, a third control signal of a third certain potential level equal to the power voltage on each of the other or others of the plurality of power supply lines, and a fourth control signal of a fourth certain potential level equal to the potential level on the power distribution line, the first control signal being supplied to the first gate electrode of the first p-channel enhancement type transistor coupled to the one of the plurality of power supply lines, the second control signal being supplied to the second gate electrode of the second p-channel enhancement type transistor associated with the one of the plurality of power supply lines, the third control signal being supplied to the first gate electrode of the first p-channel enhancement type transistor or transistors coupled to the other or others of the plurality of power supply lines, the fourth control signal being supplied to the second gate electrode of the second p-channel enhancement type transistor or transistors associated with the other or others of the plurality of power supply lines.

BRIEF DESCRIPTION OF THE DRAWINGS

The features and advantages of the semiconductor memory device according to the present invention will be more clearly understood from the following description taken in conjunction with the accompanying drawings in which:

FIG. 5A–5C is a timing chart showing the relation between the control signal and the potential level at the output node of the supply power switching circuit;

FIG. 9A–9G is a timing chart showing the bootstrapping function;

DESCRIPTION OF THE PREFERRED EMBODIMENTS

First Embodiment

Figure 10A:
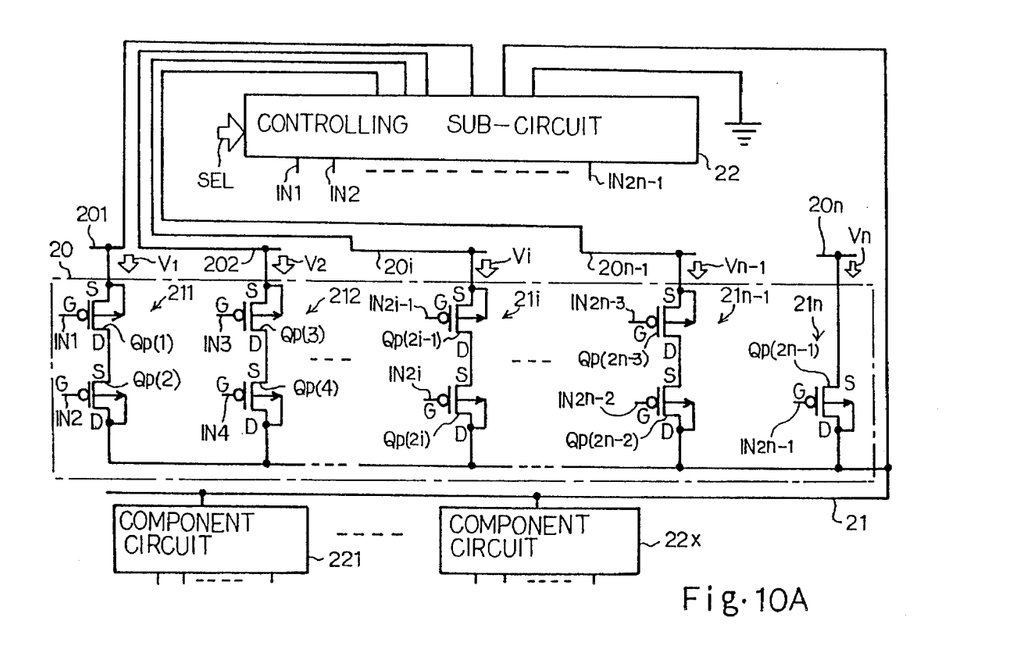
FIG. 10A is a circuit diagram showing the arrangement of a supply power switching circuit for power supply lines according to the present invention.

Referring first to FIG. 10 of the drawings, a supply power switching circuit 20 for power supply lines embodying the present invention is coupled between power sources 201, 202, ..., 20i, ..., 20n–1 and 20n and a power distribution line 21, and the power sources 201 to 20n generate power voltages V1, V2, ..., Vi, ..., Vn–1 and Vn different from one another. In this instance, the power voltage Vn is the lowest of all, and the power distribution line 21 is usually higher than the power voltage Vn. The power distribution line 21 distributes the electric power to component circuits 221 to 22x.

The supply power switching circuit 20 comprises a plurality of series sub-circuits 211, 212, ..., 21i, ..., 21n–1 and 21n associated with the power sources 201 to 20n, respectively, and a controlling sub-circuit 22. P-channel enhancement type field effect transistors form the plurality of series sub-circuits 211 to 21n. The pairs of p-channel enhancement type field effect transistors Qp(1)/Qp(2), Qp(3)/Qp(4), ..., Qp(2i–1)/Qp(2i), ... and Qp(2n–3)/Qp(2n–2) respectively constitute the series sub-circuits 211 to 20n–1, and the p-channel enhancement type field effect transistor Qp(2n–1) serves as the series sub-circuit 21n.

The controlling sub-circuit 22 is responsive to a selecting signal SEL indicative of one of the power voltages V1 to Vn so as to change control signals IN1/IN2, IN3/IN4, ... IN2i–1/IN2i, ..., IN2n–3/IN2n–2 and IN2n–1 to appropriate potential levels.

The p-channel enhancement type field effect transistors Qp(1) to Qp(2n–1) are respectively gated by the control signals IN1 to IN2n–1. "G", "S" and "D" respectively represent a gate electrode, a source node and a drain node of each of the p-channel enhancement type field effect transistors Qp(1) to Qp(2n–1). The power supply sources 201 to 20n are respectively connected to the source nodes S of the p-channel enhancement type field effect transistors Qp(1), Qp(3), Qp(2i–1), Qp(2n–3), and the power voltages V1 to Vn–1 respectively bias the channel regions of the p-channel enhancement type field effect transistors Qp(1), Qp(3), ..., Qp(2i–1), .. and Qp(2n–3). The power distribution line 21 is coupled to the drain nodes D and the channel regions of the other p-channel enhancement type field effect transistors Qp (2), Qp(4), Qp(2i), Qp(2n–2) and Qp(2n–1).

Figure 11A:
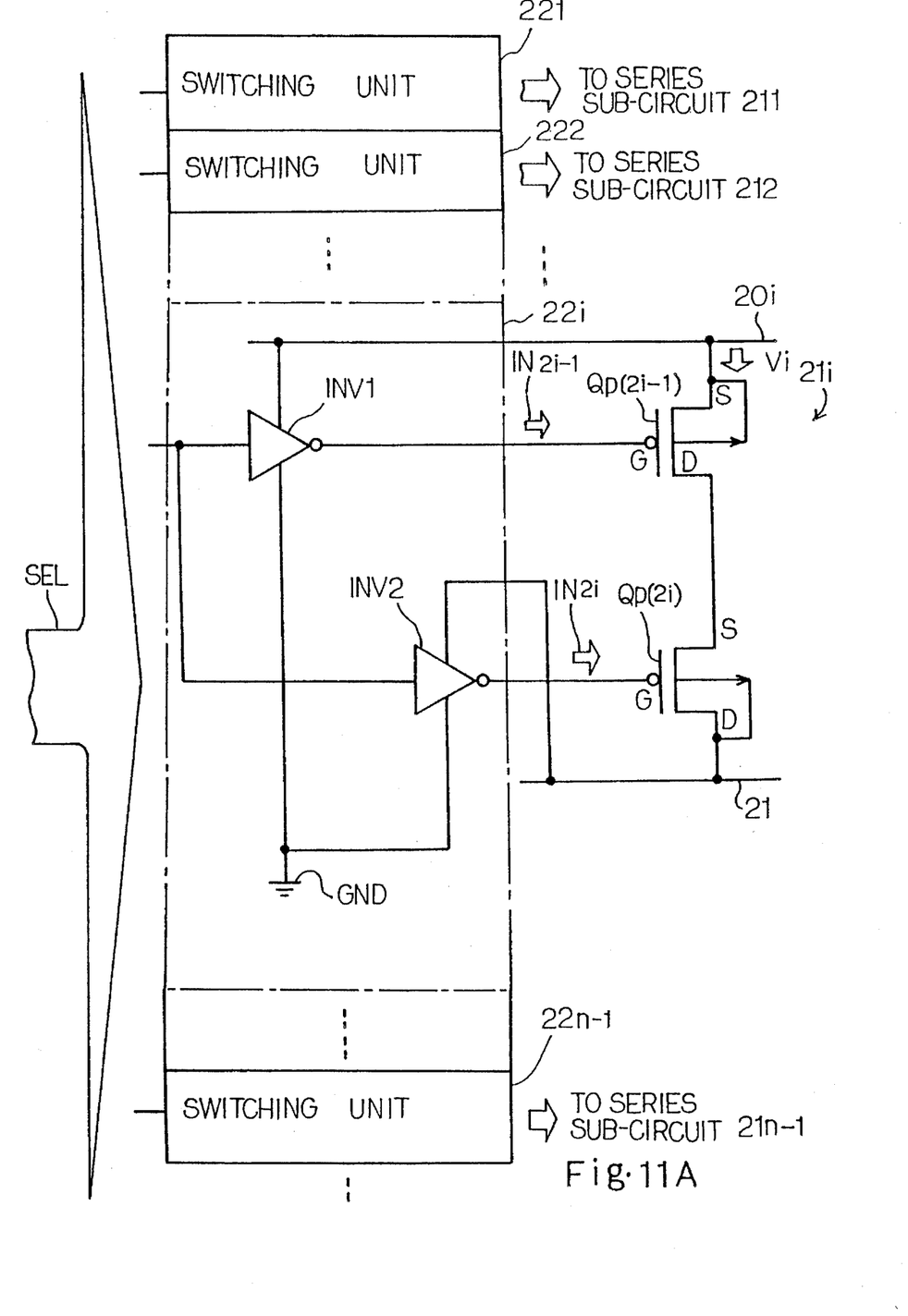
FIGS. 11A and 11b are circuit diagrams showing the arrangement of a controlling sub-circuit incorporated in the supply voltage switching circuit.
Figure 11B:
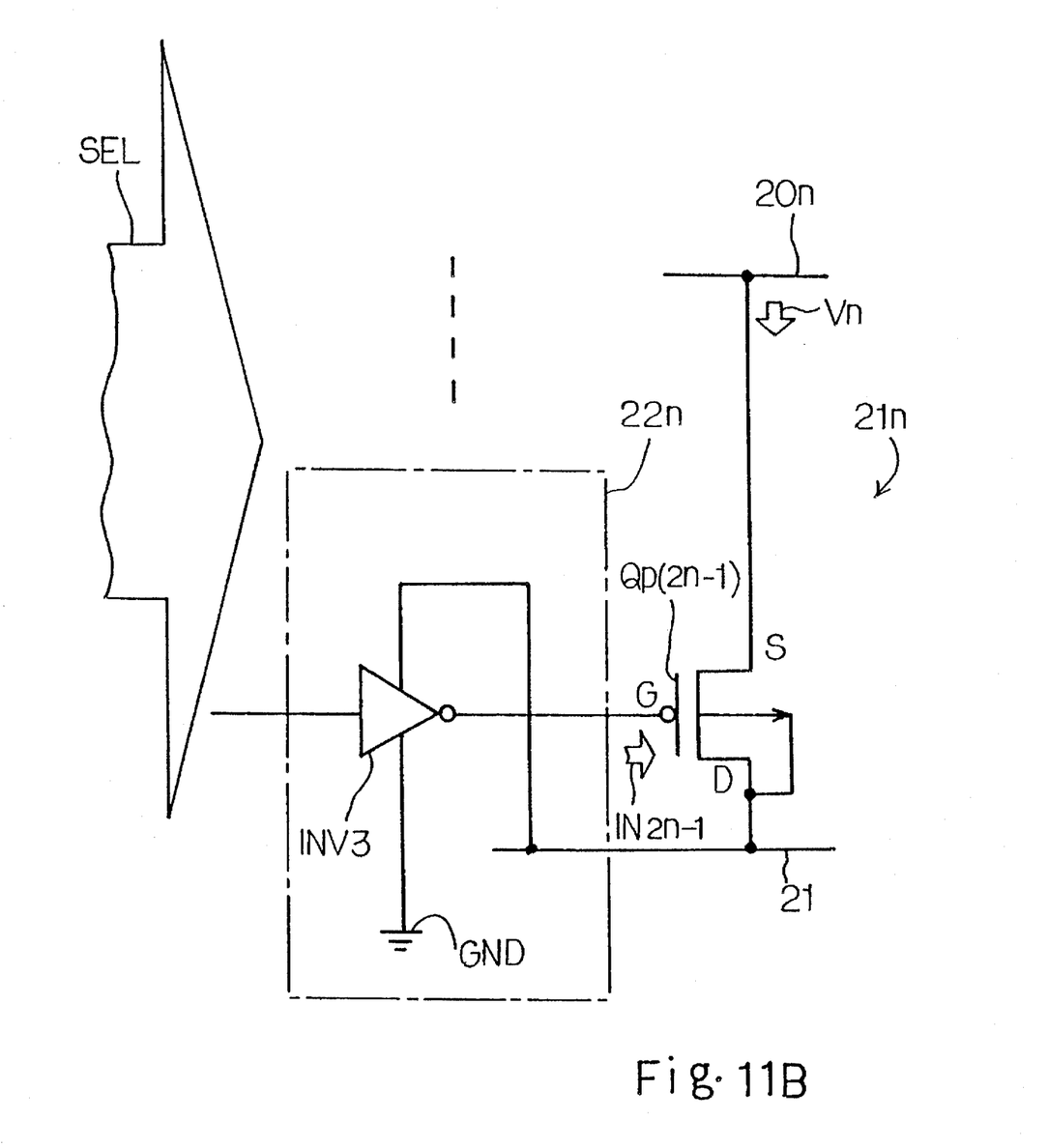

Turning to FIGS. 11A and 11B of the drawings, the controlling sub-circuit 22 includes a plurality of switching units 221, 222, ... 22i. ..., 22n–1 and 22n respectively associated with the series sub-circuits 211 to 21n. The switching units 221 to 22n–1 are similar in circuit arrangement to one another, and only the switching unit 21i is illustrated. The switching unit 22n is different from the other switching units 221 to 22n–1.

Two inverters INV1 and INV2 form in combination the switching unit 22i. The inverter INV1 is coupled between the power source 20i and a ground voltage line GND, and the other inverter INV2 is coupled between the power distribution line 21 and the ground voltage line GND. The inverters INV1 and INV2 are responsive to a signal bit of the selecting signal so as to change the control signal IN2i–1 between the power voltage Vi and the ground level and the control signal IN2i between the potential level on the power distribution line 21 and the ground level.

When the selecting signal SEL selects the power voltage Vi, the signal bit is changed to the high level of 5 volts, and the inverters INV1 and INV2 change the control signals IN2i–1 and IN2i to a potential level lower than the power voltage Vi by the threshold of the p-channel enhancement type field effect transistor Qp(2i–1) and another potential level lower than the potential level at the source node S of the p-channel enhancement type field effect transistor Qp(2i) by the threshold of the transistor Qp(2i). In this instance, the potential level and another potential level are the ground level. However, while the other power voltage is being selected, the signal bit remains in the ground level, and the inverters INV1 and INV2 maintain the control signal IN2i–1 at the power voltage Vi and the potential level on the power distribution line 21.

On the other hand, the switching unit 22n is implemented by only one inverter INV3 coupled between the power distribution line 21 and the ground voltage line GND. The inverter INV3 is responsive to another signal bit of the selecting signal SEL so as to change the control signal IN2n–1 between the potential level on the power distribution line 21 and the ground level.

While the signal bit is staying in the ground level, the inverter INV3 maintains the control signal IN2n–1 at the potential level on the power distribution line 21. On the other hand, when the signal bit is changed to the high level, the inverter INV3 changes the control signal IN2n–1 to a certain potential level lower than the potential level at the source node S of the p-channel enhancement type field effect transistor Qp(2n–1) by the threshold of the transistor Qp(2n–1), and the certain potential level is the ground level in this instance.

Description is hereinbelow made on circuit behavior on the assumption that the selecting signal SEL is representing the power voltage Vi. The controlling sub-circuit 22 changes the control signals IN2i–1 and IN2i to a certain level lower than the potential level on the power distribution line 21 by at least the threshold level thereof. In this instance, the control signals IN2i–1 and IN2i are changed to the ground level. The controlling sub-circuit 22 further changes the control signals IN1, IN3 and IN2n–3 to the power voltage levels V1, V2, ... and Vn–1, and the other control signals IN2, IN4, ..., IN2n–2 and IN2n–1 are changed to the potential level on the power distribution line 21. As a result, the plurality of series sub-circuits 211 to 21n becomes equivalent to the circuit arrangement shown in FIG. 10B.

Figure 10B:
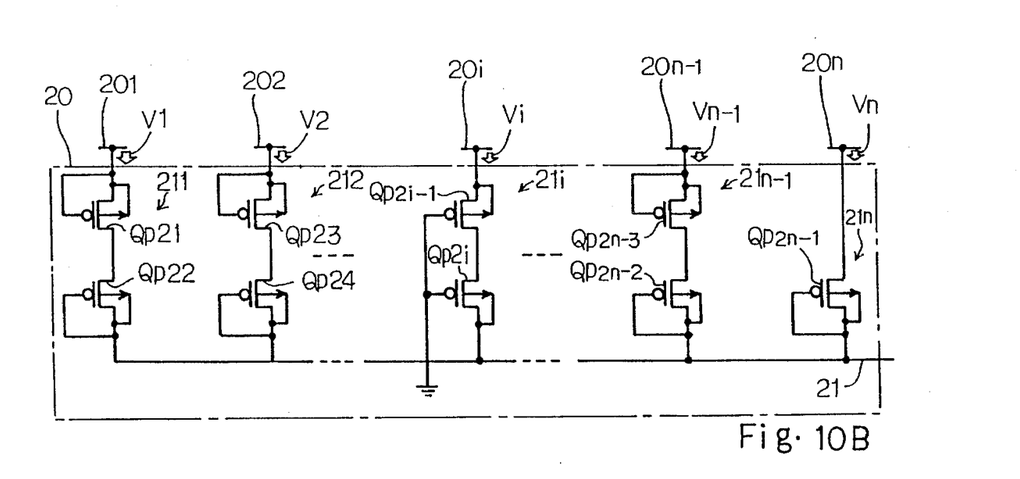
FIG. 10B is a circuit diagram showing the supply power switching circuit supplying a power voltage to a power distribution line.

The p-channel enhancement type field effect transistors Qp(2i–1) and Qp(2i) turn on, and the other p-channel enhancement type field effect transistors Qp(1), Qp(2), Qp(3), Qp(4), ..., Qp(2n–3), Qp(2n–2) and Qp(2n–1) turn off. As a result, the power voltage Vi is transferred through the series sub-circuit 21i to the power distribution line 21.

If the selecting signal SEL is indicative of the lowest power voltage Vn, the controlling sub-circuit 22 changes the control signal IN2n–1 to the ground level. The control signals IN1, IN3, .. IN2i–1, ... and IN2n–3 are changed to the power voltage levels V1, V2, ..., Vi, ... and Vn–1, respectively, and the controlling sub-circuit 22 changes the other control signals IN2, IN4, ... IN2i, ... and IN2n–2 to the potential level on the power distribution line 21. The series sub-circuits 211 to 21n–1 isolates the power distribution line 21 from the power sources V1 to Vn1, and the lowest power voltage Vn is supplied through the p-channel enhancement type field effect transistor Qp(2n–1) to the power distribution line 21.

Figure 12:
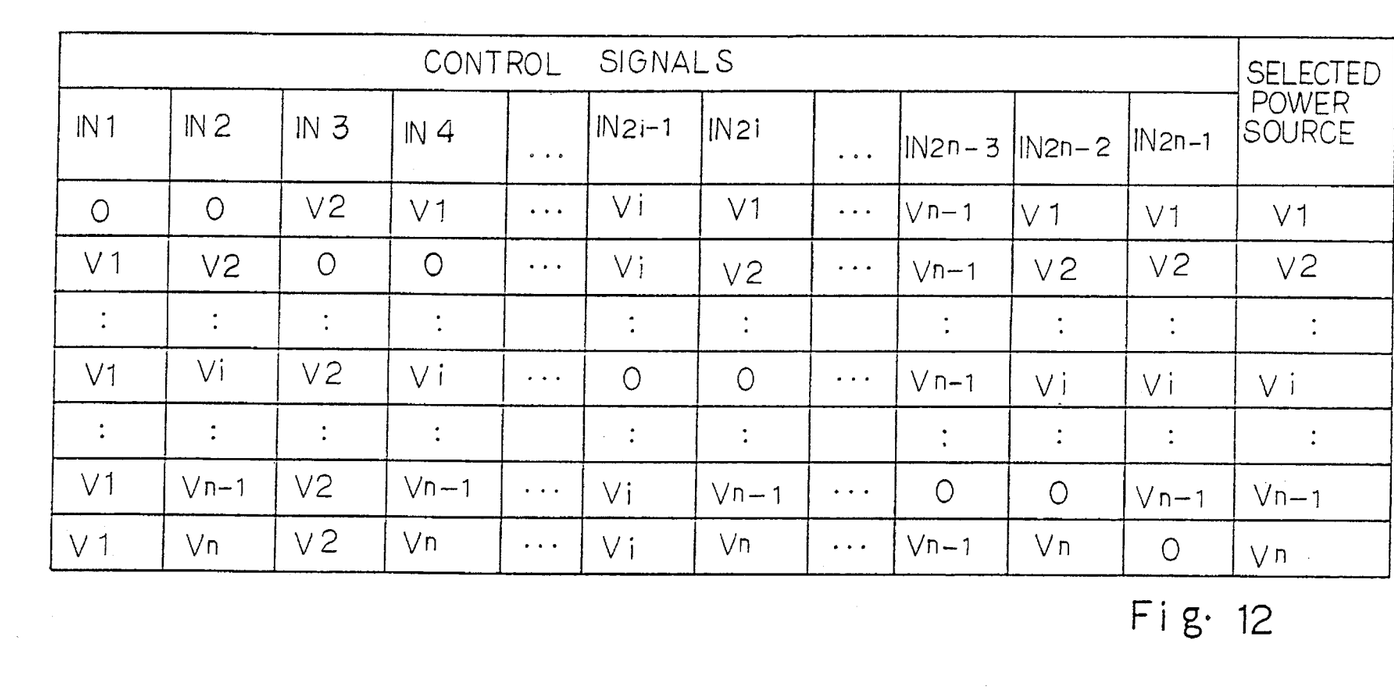
FIG. 12 is a view showing relation between selected power source and control signals supplied to the supply power switching circuit.

FIG. 12 shows relation between the control signals IN1 to IN2n–1 and the selected power source. When x and y are a first integer ranging from 1 to n–1 and a second integer ranging from 1 to n–1 except for the first integer, the power voltage Vx on the power distribution line 21 is resulted from the control signals IN2x–1 and IN2x of the ground level, the control signals IN(2y–1) of the respective power voltages Vy and the control signal IN2y of the potential level on the power distribution line 21, because only the p-channel enhancement type field effect transistors Qp(2x–1) and Qp(2x) turn on.

When z is a third integer ranging from 1 to (n–1), the lowest power voltage Vn on the power distribution line 21 is resulted from the control signals IN(2z–1) of the power voltage Vz and the control signals IN2z of the potential level on the power distribution line 21, because only the p-channel enhancement type field effect transistor Qp(2n–1) turns on.

Thus, the supply voltage switching circuit according to the present invention is fabricated from a small number of field effect transistors, and is stable regardless of potential fluctuation of the power sources.

Second Embodiment

Figure 13:
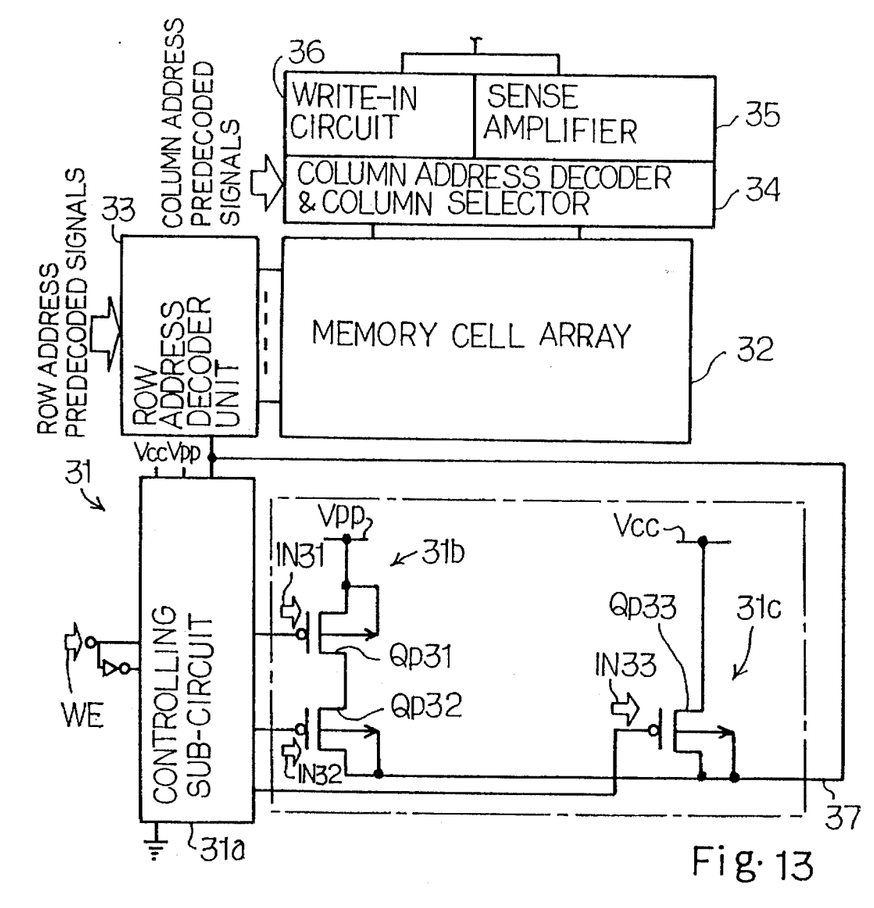
FIG. 13 is a circuit diagram showing a flash-write electrically erasable and programmable read only memory device according to the present invention.

Turning to FIG. 13 of the drawings, a supply voltage switching circuit 31 embodying the present invention is incorporated in a flash-write electrically erasable and programmable read only memory device. Although the flash-write electrically erasable and programmable read only memory device further comprises a NOR-type memory cell array 32, a row address decoder unit 33, a column address decoder and column selector unit 34, a sense amplifier 35 and a write-in circuit 36. These are similar to those of the prior art flash-write electrically erasable and programmable read only memory device, and no further description is incorporated hereinbelow.

The supply voltage switching circuit 31 selectively supplies the write-in voltage Vpp of 12 volts and the positive power voltage Vcc of 5 volts to a power distribution line 37, and largely comprises a controlling sub-circuit 31a and two series sub-circuits 31b and 31c. The controlling sub-circuit 31a is similar to the controlling sub-circuit 22, and changes the control signals IN31, IN32 and IN33 in response to a write enable signal WE.

Two p-channel enhancement type field effect transistors Qp31 and Qp32 form the series sub-circuit 31b, and are coupled between a write-in voltage line Vpp and the power distribution line 37. The control signals IN31 and IN32 are respectively supplied to the gate electrodes of the p-channel enhancement type field effect transistors Qp31 and Qp32. A p-channel enhancement type field effect transistor Qp33 serves as the other series sub-circuit 31c, and is responsive to the control signal IN33.

When the write enable signal WE is staying at inactive high level, the controlling sub-circuit maintains the control signals IN31, IN32 and IN33 to the write-in voltage Vpp, the positive power voltage level Vcc and the ground level. The p-channel enhancement type field effect transistors Qp31 and Qp32 are turned off, and the p-channel enhancement type field effect transistor Qp33 is turned on. The p-channel enhancement type field effect transistor Qp33 transfers the positive power voltage Vcc through the power distribution line 37 to the row address decoder unit 33. The row address decoder unit 33 supplies the positive power voltage Vcc to a selected word line, and the column address decoder and column selector 34 connects the sense amplifier 35 to a selected digit line. The sense amplifier 35 supplies current to the selected digit line to see whether the selected memory cell is in the erased state or the write-in state.

On the other hand, if the write enable signal WE is changed to the active low level, the controlling subcircuit 31a changes the control signals IN31, IN32 and IN33 to the ground level, the ground level and the potential level on the power distribution line 37, i.e., the write-in voltage.

The p-channel enhancement type field effect transistors Qp31 and Qp32 turn on, and the p-channel enhancement type field effect transistor Qp33 turns off. Then, the write-in voltage Vpp is supplied to the power distribution line 37, and the row address decoder 33 applies the write-in voltage to a selected word line. The column address decoder and column selector 34 connects the write-in circuit to a selected digit line, and hot electrons are injected into the floating gate electrode of the selected memory cell.

The supply voltage switching circuit 31 requires only three inverters of the controlling sub-circuit 31a and the three p-channel enhancement type field effect transistors Qp31 to Qp33, and the circuit arrangement is simpler than those of the prior art supply voltage switching circuits.

The supply voltage switching circuit according to the present invention does not include a charge pump circuit nor a bootstrapping circuit, and potential fluctuation on the write-in voltage line Vpp does not strongly affect the supply voltage switching circuit.

Figure 14:
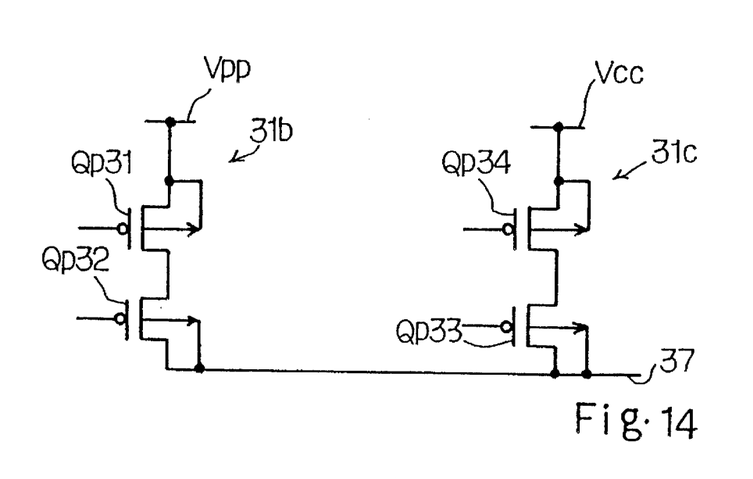
FIG. 14 is a circuit diagram showing the arrangement of another supply voltage switching circuit available for the flash-write electrically erasable and programmable read only memory device.

The supply voltage switching circuit 31 may be modified as shown in FIG. 14. A p-channel enhancement type field effect transistor Qp34 is added to the series sub-circuit 31c, and the p-channel enhancement type field effect transistors Qp33 and Qp34 are controlled by the controlling sub-circuit 31a as similar to the p-channel enhancement type field effect transistors Qp32 and Qp31.

Although particular embodiments of the present invention have been shown and described, it will be obvious to those skilled in the art that various changes and modifications may be made without departing from the spirit and scope of the present invention.

For example, the supply power switching circuit according to the present invention is available for any kind of semiconductor integrated circuit device such as, for example, a semicustom-made integrated circuit device, other kind of semiconductor memory device in so far as it requires more than two power voltages. The other kind of semiconductor memory device is an electrically programmable read only memory device or a semiconductor random access memory device supplied with two different positive power voltages and the ground level from the outside thereof.

Each of the inverters INV1. INV2 and INV3 may be replaced with a buffer circuit, a NAND gate or a NOR gate.

What is claimed is:

1. A supply voltage switching circuit incorporated in a semiconductor integrated circuit device, comprising:

a plurality of first series sub-circuits coupled to a power distribution line and a plurality of power supply lines different in power voltage thereon, each of said plurality of first series sub-circuits including a first p-channel enhancement type transistor having a first source node coupled to associated one of said plurality of power supply lines, a first gate electrode and a first drain node and a second p-channel enhancement type transistor having a second source node coupled to said first drain node, a second gate electrode and a second drain node coupled to said power distribution line; and a controlling sub-circuit coupled to said plurality of first series sub-circuits, and responsive to a selecting signal indicative of one of said plurality of power supply lines so as to produce a first control signal of a first certain potential level lower than the power voltage on associated one of said plurality of power supply lines by at least a first threshold level of said first p-channel enhancement type transistor coupled to said one of said plurality of power supply lines, a second control signal of a second certain potential level lower than a potential level on said power distribution line by at least a second threshold of said second p-channel enhancement type transistor associated with said one of said plurality of power supply lines, a third control signal of a third certain potential level equal to the power voltage on each of the other or others of said plurality of power supply lines, and a fourth control signal of a fourth certain potential level equal to the potential level on said power distribution line, said first control signal being supplied to said first gate electrode of said first p-channel enhancement type transistor coupled to said one of said plurality of power supply lines so that said first p-channel enhancement type transistor of said one of said plurality of power supply lines turns on, said second control signal being supplied to said second gate electrode of said second p-channel enhancement type transistor associated with said one of said plurality of power supply lines so that said second p-channel enhancement type transistor of said one of said plurality of power supply lines turns on, said third control signal being supplied to said first gate electrode of each first p-channel enhancement type transistor coupled to each of said plurality of power supply lines except for said one of said plurality of power lines so that each first p-channel enhancement transistor is turned off, said fourth control signal being supplied to said second gate electrode of each second p-channel enhancement type transistor associated with said each of said plurality of power supply lines except for said one of said plurality of power lines so that each said second p-channel enhancement type transistor is turned off.

2. The supply voltage switching circuit as set forth in claim 1, in which one of said plurality of first series sub-circuits is replaced with a second series sub-circuit including a third p-channel enhancement type transistor having a third source node coupled to another power supply line of the lowest power voltage, a third gate electrode and a third drain node coupled to said power distribution line, said second control signal being supplied to said third gate electrode when said selecting signal is indicative of said lowest power supply line, said fourth control signal being supplied to said third gate electrode when said selecting signal is indicative of said one of said plurality of power supply lines.

3. The Supply voltage switching circuit as set forth in claim 1, in which said first certain potential level and said second certain potential level are the ground level.

4. The supply voltage switching circuit as set forth in claim 1, in which said semiconductor integrated circuit device is an electrically erasable and programmable read only memory device, and said plurality of first series sub-circuits are coupled between a write-in voltage line and said power distribution line and between a read-out voltage line and said power distribution line, respectively, said write-in voltage line higher in potential level than said read-out voltage line.

5. The supply voltage switching circuit as set forth in claim 2, in which said second series sub-circuit and the other of said plurality of first series sub-circuits are coupled between a write-in voltage line and said power distribution line and between a read-out voltage line and said power distribution line, respectively, said write-in voltage line higher in potential level than said read-out voltage line.

6. The supply voltage switching circuit as set forth in claim 1, in which said controlling sub-circuit includes a plurality of switching units associated with said plurality of first series sub-circuits, each of said plurality of switching units having a first logic gate powered by associated one of said plurality of power supply lines and a source of said first certain potential level and a second logic gate powered by said power distribution line and a source of said second certain potential level, said first and second logic gates being responsive to a signal bit of said selecting signal for producing said first control signal or said third control signal and said second control signal or said fourth control signal.

7. The supply voltage switching circuit as set forth in claim 6, in which said first and second logic gates are inverters.

8. The supply voltage switching circuit as set forth in claim 6, in which said first certain potential level and said second certain potential level are the ground level.

9. The supply voltage switching circuit as set forth in claim 2, in which said controlling sub-circuit includes a plurality of switching units associated with said second series sub-circuit and the other or others of said plurality of first series sub-circuits, respectively, each of said plurality of switching units associated with said other or others of said plurality of first series sub-circuits having a first logic gate powered by associated one of said plurality of power supply lines and a source of said first certain potential level and a second logic gate powered by said power distribution line and a source of said second certain potential level, the switching unit associated with said second series sub-circuit having a third logic gate powered by said source of said second certain potential level and said power distribution line, said first and second logic gates being responsive to a signal bit of said selecting signal for producing said first control signal or said third control signal and said second control signal or said fourth control signal, said third logic gate being responsive to another signal bit of said selecting signal for producing said second control signal or said fourth control signal.

10. The supply voltage switching circuit as set forth in claim 9, in which said first, second and third logic gates are inverters.

11. The supply voltage switching circuit as set forth in claim 9, in which said first certain potential level and said second certain potential level are the ground level.

* * * * *